United States Patent [19]

Scaccianoce et al.

[11] Patent Number: 6,060,762

[45] Date of Patent: May 9, 2000

[54] INTEGRATED STRUCTURE WITH REDUCED INJECTION OF CURRENT BETWEEN HOMOLOGOUS REGIONS

[75] Inventors: Salvatore Scaccianoce, Riposto; Stefano Sueri, Cantania, both of Italy

[73] Assignee: CO.RI.M.ME. Consorzio per la Ricerca Sulla Microelettronica Nel Mezzogiorno, Catania, Italy

[21] Appl. No.: 08/855,212

[22] Filed: May 13, 1997

[30] Foreign Application Priority Data

May 14, 1996 [EP] European Pat. Off. ............ 968 30 277

[51] Int. Cl.⁷ .......................... H01L 27/082; H01L 29/00
[52] U.S. Cl. ............................ 257/565; 257/547
[58] Field of Search ..................... 257/565, 547, 257/552, 553, 555, 556, 557; 318/362

[56] References Cited

U.S. PATENT DOCUMENTS 5,287,047  2/1994  Murayama et al. ..................... 318/362
5,514,901  5/1996  Peppiette et al. ....................... 257/547

FOREIGN PATENT DOCUMENTS

0328905 A1  1/1989  European Pat. Off. ............... 257/565

OTHER PUBLICATIONS

Patent Abstracts of Japan, vol. 11, No. 363, JP–A–62136872 (Oki Electric Ind Co. Ltd.), Jun. 19, 1987.
Patent Abstracts of Japan, vol. 11, No. 122, JP–A–P61268036 (Toshiba Corp.), Nov. 27, 1986.

*Primary Examiner*—Steven H. Loke
*Attorney, Agent, or Firm*—Theodore E. Galanthay; Allen, Dyer, Doppelt, Milbrath & Gilchrist, P.A.

[57] ABSTRACT

An integrated semiconductor structure comprises two homologous P-type regions formed within an N-type epitaxial layer. A P-type region formed in the portion of the epitaxial layer disposed between the two P-type regions includes within it an N-type region. This N region is electrically connected to the P region by means of a surface metal contact. The structure reduces the injection of current between the first and second P regions, at the same time preventing any vertical parasitic transistors from being switched on.

9 Claims, 6 Drawing Sheets

INTEGRATED STRUCTURE WITH REDUCED INJECTION OF CURRENT BETWEEN HOMOLOGOUS REGIONS

FIELD OF THE INVENTION

The present invention relates to integrated semiconductor structures and in particular, but not in a limiting manner, to an integrated structure including well regions.

BACKGROUND OF THE INVENTION

In an integrated semiconductor structure, there are wells in which components or circuit units which have to be electrically insulated from one another are formed. A widely used insulation technique consists of the creation within a "chip" of semiconductor material of insulation regions with the opposite type of conductivity to that of the semiconductor material. During the operation of these integrated structures, the semiconductor material of the chip is brought to a potential relative to the insulation regions, such that the P-N junctions created between the semiconductor material and the insulation regions are reverse biased; the reversed polarization of these junctions ensures the insulation between the regions in which the various components or circuit units are formed.

In an integrated semiconductor structure comprising two or more regions formed with the same type of doping (homologous regions) within a chip of semiconductor material having doping of the opposite type, undesired circulation of current may occur, causing anomalous operation of the integrated structure. These currents are caused by the direct polarization of the P-N junctions described above which normally have reversed polarities. In particular, in a situation of this type, a lateral parasitic transistor is activated between two adjacent homologous regions with the consequent injection of current from the region which acts as the emitter to the region which acts as the collector. This current also switches on any vertical parasitic transistors present in the region which acts as a collector.

For example, the integrated structure shown in FIG. 1a will be considered. For simplicity of description, reference will be made below to P-type regions formed in an N-type semiconductor material; naturally, corresponding considerations are applicable if the regions have the opposite doping. The integrated structure shown in the drawing comprises an N-type epitaxial layer 110 formed on a substrate, not shown in the drawing. Two P-type regions 120 and 130 are formed within the epitaxial layer 110; and within the region 130 there is a further N-type region 140. During normal operation of the structure, the substrate, and hence the epitaxial layer 110, is kept at a positive potential relative to the potential of the regions 120 and 130. The P-N junctions created between the substrate 110 and the regions 120 and 130 therefore have reversed polarities, that is, polarities which ensure insulation between the two regions.

A typical example is that in which the integrated structure described above is a mixed-type integrated circuit, that is, with insulated signal-processing circuits in one or more wells and with vertical power transistors having their collector (or drain) regions in the epitaxial layer 110. It is assumed that the region 120 includes the anode of a recirculating diode associated with a vertical power transistor, not shown, integrated in the same circuit and having an inductive load. The region 130, on the other hand, includes the insulation region of a well. The region 140 includes the signal-processing components of the control circuitry of the power transistor.

In a situation of transitory or anomalous polarization of the circuit, the epitaxial layer 110 may be at a negative potential relative to that of the region 120, that is, the recirculation diode may be polarized for transmission. To examine the effect of this situation, it can be seen that the two regions 120 and 130 form a parasitic component with the substrate, as shown schematically in the equivalent circuit shown in FIG. 1b. In particular, the parasitic component $T_1$ is a lateral PNP transistor created by the P region 120 (emitter), by the N epitaxial layer 110 (base) and by the P region 130 (collector). Moreover, in the example illustrated, a further parasitic component is constituted by a vertical NPN transistor Tv created by the N region 140 (collector), by the P region 130 (base) and by the N epitaxial layer 110 (emitter). As shown in the drawing, the collector of the transistor $T_1$ is connected to the base of the transistor Tv (common region 130) and the emitter of the transistor Tv is connected to the base of the transistor $T_1$ (common epitaxial layer). In the situation described above, the PNP transistor $T_1$ becomes conductive, causing an injection of current, the collector current of the transistor $T_1$, from the region 120 to the region 130. In the example shown in the drawing, this injection of current also switches on the vertical parasitic NPN transistor Tv.

It is known that, in a generic transistor, if the base, collector and emitter currents are indicated Ib, Ic and Ie, respectively and its current gain is indicated $\beta$ then, then:

$$Ic = \beta \cdot Ib$$

Since Ie=Ib+Ic the following can be deduced, $$Ic = \beta(Ie - Ic);\ Ic = \beta \cdot Ie - \beta \cdot Ic;\ (1+\beta) \cdot Ic = \beta \cdot Ie$$

from which:

$$Ic = \frac{\beta}{1+\beta} Ie$$

The current gain and the base, collector and emitter currents, respectively, of a generic transistor Tn are indicated below by the symbols $\beta n$, Ibn, Icn and Ien.

The current injected from the region 120 into the region 130, which is the collector current Icl of the transistor $T_1$, is:

$$Icl = \frac{\beta l}{1+\beta l} Iel$$

This current Icl is equal to the current Ibv injected into the base of the transistor Tv.

Various solutions are known in the art for minimizing the effects of the parasitic transistors described above. It will be noted that all of the known solutions address the problem of lateral parasitic transistors and that of any vertical parasitic transistors separately. As far as the lateral parasitic transistor between the two P regions is concerned, a first solution consists of suitable spacing of the two regions; however, this solution involves a considerable waste of useful area of the integrated structure.

A different solution is that of increased doping of the base of the parasitic transistor, that is, the portion of the epitaxial layer disposed between the two P regions, by means of a suitable region with a high concentration of N-type impurities. The gain of the lateral parasitic PNP transistor is thus reduced; since, as shown above, the current injected into the P region 130 is proportional to the gain of this transistor, the injection of current is thus reduced. If the substrate (and hence the epitaxial layer 110) has to withstand high voltages (as in the mixed integrated circuit described, in which the substrate comprises the collector of the power transistor) this highly doped N-type region brings the upper surface of the chip to a potential close to that of the collector electrode of the power transistor. Since this potential may be very high in comparison with the surface potentials of the adjacent P regions, a strong surface electric field may be formed. To reduce the effects of the surface electrical field thus created, an adequate structure for terminating the homologous P-type regions in the regions with high concentrations of N-type impurities is required, with a consequent considerable waste of area of the chip.

A further solution, shown in FIG. 2a, consists of the formation of a further P-type region 210 (a "channel stopper") in the epitaxial layer 110 disposed between the regions 120 and 130, that is, in the base region of the lateral parasitic transistor. This region 210 splits the parasitic component between the two regions 120 and 130 into two lateral parasitic transistors Tl1 and Tl2, as shown schematically in the equivalent circuit of FIG. 2b. In particular, the lateral parasitic PNP transistor Tl1 is created by the P region 120 (emitter), by the N epitaxial layer 110 (base) and by the further P-type region 210 (collector), and the lateral parasitic PNP transistor Tl2 is created by the P-type region 210 (emitter), by the N epitaxial layer 110 (base) and by the region 130 (collector). As shown in the drawing, the two transistors Tl1 and Tl2 have a common base (the epitaxial layer 110). Moreover, the collector of the transistor Tl1 is connected to the emitter of the transistor Tl2 (common P-type region 210). As in the previous case, the collector of the transistor Tl2 is connected to the base of the transistor Tv (common P-type region 130) and the emitter of the transistor Tv is connected to the bases of the two transistors Tl1 and Tl2 (common epitaxial layer 110).

In this integrated structure, in a situation of transitory or anomalous polarization, one of the two parasitic transistors Tl1 and Tl2 is brought to a high level of saturation with a consequent reduction in its gain and hence in the injection of current into the region 130. In particular, the current injected from the region 120 into the region 130, which is equal to the base current Ibv of the transistor Tv, is given by the collector current Icl2 of the transistor Tl2:

$$Icl2 = \frac{\beta l2}{1 + \beta l2} Iel2$$

Since the emitter current Iel2 of the transistor Tl2 is equal to the collector current Icl1 of the transistor Tl1 the following is deduced:

$$Icl2 = \frac{\beta l2}{1 + \beta l2} Icl1 = \frac{\beta l2}{1 + \beta l2} \frac{\beta l1}{1 + \beta l1} Iel1$$

Another solution shown in FIG. 3a, consists of the electrical connection of the P-type region 210 to the epitaxial layer 110 by means of a surface metal contact strip 310. To favor good ohmic contact with the surface of the epitaxial layer 110, in the example shown in the drawing there is also a region 320 with a high N-type concentration which prevents the formation of a PN junction between the N epitaxial layer 110 and the metal strip 310 (generally aluminum) containing P-type impurities. As shown in FIG. 3b, the emitter of the transistor Tl2 (P-type region 210) is short-circuited to its own base (the epitaxial layer 110) by means of the metal strip 310. The transistor Tl2 is therefore always cut off so that the injection of current between the two regions 120 and 130 is completely nullified. As described above, if the substrate (and therefore the epitaxial layer) has to withstand high voltages, this solution also requires an adequate termination structure resulting in the occupation of considerable area.

To reduce the effects of any vertical parasitic transistor, such as the transistor Tv, on the other hand, a dynamic polarization circuit is used and is constituted by a vertical transistor of the same type as the parasitic transistor the switching-on of which is to be avoided. As shown in FIG. 4a, a further P-type region 410 is created in the epitaxial layer 110 and an N-type region 420 is formed therein. The N-type region 420 is connected electrically to the region 130 by means of a surface metal contact strip 430.

The circuit equivalent to the structure described above is shown in FIG. 4b. As described above, the circuit shown in the drawing comprises the vertical parasitic NPN transistor Tv created by the N-type region 140 (collector), by the P-type region 130 (base) and by the N epitaxial layer 110 (emitter). The dynamic polarization circuit is constituted by a vertical NPN transistor Tp constituted by the N-type region 420 (collector), by the P-type region 410 (base) and by the N-type epitaxial layer 110 (emitter). As shown in the drawing, the emitter of the transistor Tp is connected to the emitter of the transistor Tv (common epitaxial layer 110) and the collector of the transistor Tp (N-type region 420) is connected to the base of the transistor Tv (region 130) by means of the metal connection 430. The circuit shown in the drawing comprises a further lateral parasitic transistor Tl', constituted by the P-type region 130 (collector) by the N-type epitaxial layer 110 (base) and by the P-type region 410 (emitter). The collector of the transistor Tl' is connected to the base of the transistor Tv (common region 130) and to the collector of the transistor Tp (by means of the metal connection 430), the emitter of the transistor Tl' is connected to the base of the transistor Tp (common P-type region 410), and the base of the transistor Tl is connected to the emitters of the transistors Tv and Tp (common epitaxial layer 110).

The transistor Tp is supplied by the supply system of the integrated structure by means of suitable driving circuitry (not shown in the drawing). As soon as the substrate potential of the structure (that is, the potential of the epitaxial layer 110) falls below a predetermined threshold (higher than that necessary to make the vertical parasitic transistor Tv conductive) a driver stage constituted, for example, by a constant-current generator (not shown in the drawing) is activated and supplies to the base terminal of the transistor Tp a current of a value such as to bring the transistor to saturation. The base and the emitter of the transistor Tv are therefore kept at the same potential, thus preventing the vertical parasitic transistor from being switched on.

It should be noted that, since the current supplied to the base terminal of the transistor Tp from the supply system is of limited value, this transistor cannot be saturated if the voltage difference between the substrate (and hence the epitaxial layer 110) and the region 130 assumes high negative values, because of the strong activation of the parasitic transistors which inject current into the region 130. This is particularly critical when the integrated structure is constituted by a mixed circuit (signal and power) comprising a vertical power transistor having its own collector included in the weakly doped N-type epitaxial layer 110. The emitter is constituted by a region with strong N-type doping formed within a P-type region which constitutes the base of the same transistor. In this case, the transistor Tp is normally formed by the same process which is used for the formation of the power transistor described above. It is therefore constituted by an emitter region with a low level of doping (epitaxial layer 110) and by a collector region with a high level of doping (region 420) so that it has a very low current gain.

From an observation of the equivalent circuit shown in FIG. 4b it can also be seen that some of the current supplied to the base terminal of the transistor Tp is lost because of the lateral parasitic transistor Tl'. As well as being taken away from the transistor Tp, this current is injected into the region 130. It therefore has to be extracted from the region 130 (by means of the transistor Tp), together with the current injected therein from the P region 120 by means of the lateral parasitic transistor Tl formed between the two P regions 120 and 130, as in the previous case.

SUMMARY OF THE INVENTION

These problems of the prior art are avoided by the present invention. In fact, the present invention provides a structure integrated in a chip of semiconductor material with a first type of conductivity, the integrated structure comprising a first region and a second region with a second type of conductivity, extending into the semiconductor material from a surface of the chip to form a first junction and a second junction, means for reducing the injection of current from the first region to the second region when the first junction is polarized for transmission, characterized in that the means include a third region with the second type of conductivity extending from the surface into a portion of the semiconductor material disposed between the first region and the second region, a fourth region with the first type of conductivity extending from the surface into the third region, and electrical connection means between the fourth region and the second region.

BRIEF DESCRIPTION OF THE DRAWINGS

Various embodiments of the present invention will now be described by way of example, with reference to the appended drawings, in which:

FIG. 6b shows the circuit equivalent to the structure of FIG. 6a.

DETAILED DESCRIPTION OF THE PREFERRED EMBODIMENTS

Figure 1A:
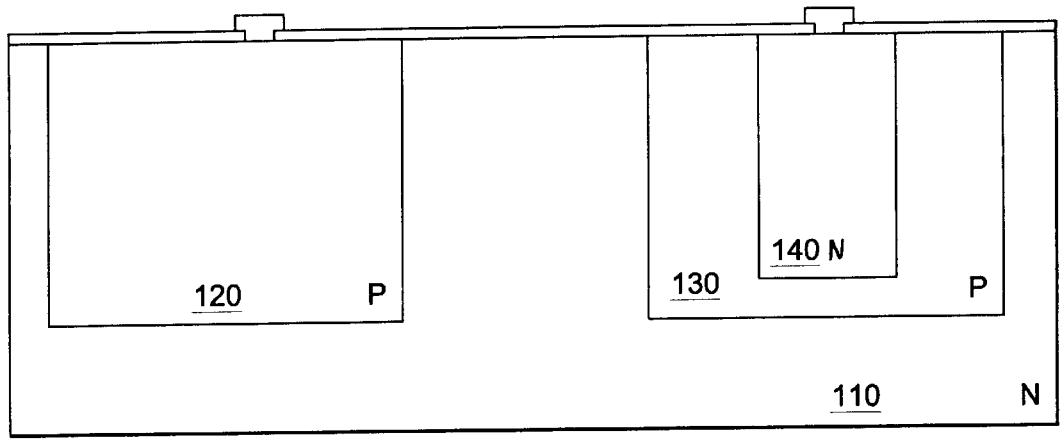
FIG. 1a shows schematically a known integrated structure according to the prior art.
Figure 1B:
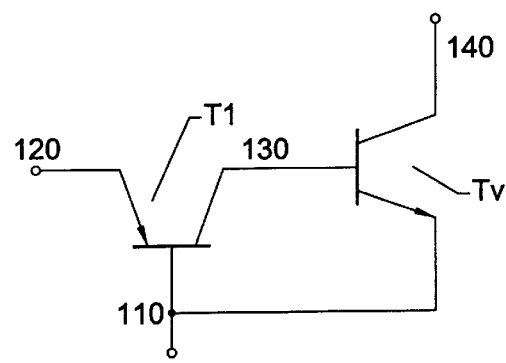
FIG. 1b shows the circuit equivalent to the structure of FIG. 1a according to the prior art.
Figure 2A:
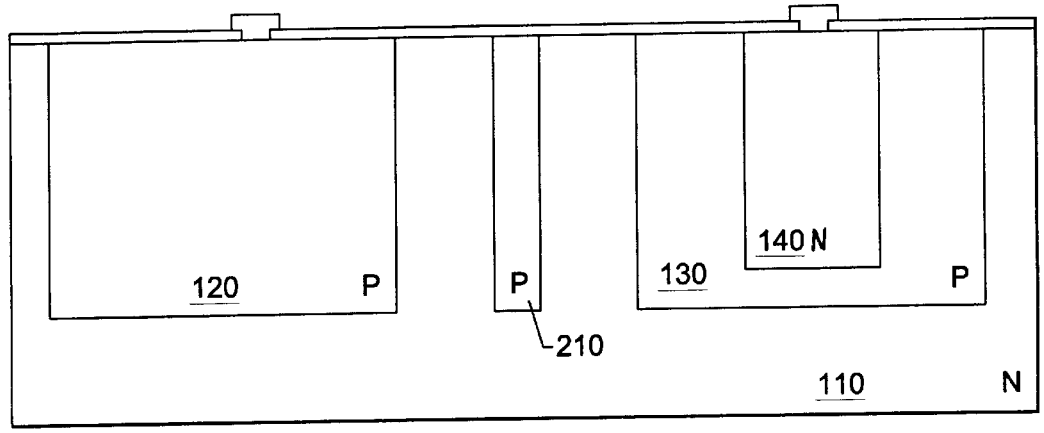
FIG. 2a shows schematically a known integrated structure with devices for reducing the effects of a lateral parasitic transistor according to the prior art.
Figure 2B:
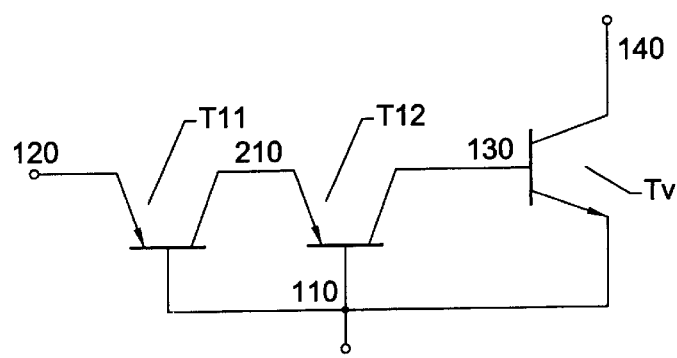
FIG. 2b shows the circuit equivalent to the structure of FIG. 2a according to the prior art.
Figure 3A:
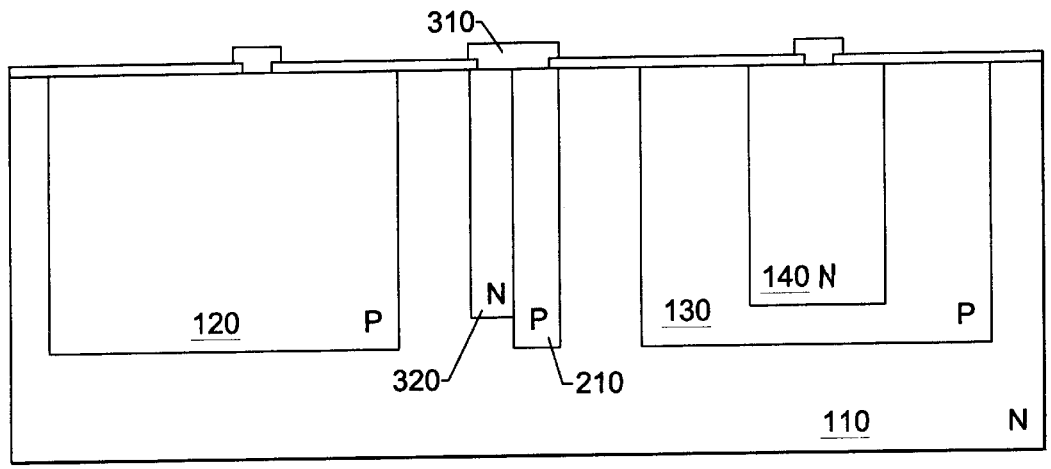
FIG. 3a shows schematically a further known integrated structure for reducing the effects of a lateral parasitic transistor.
Figure 3B:
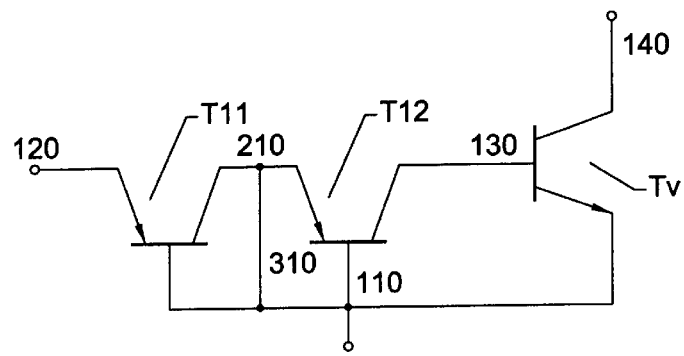
FIG. 3b shows the circuit equivalent to the structure of FIG. 3a according to the prior art.
Figure 4A:
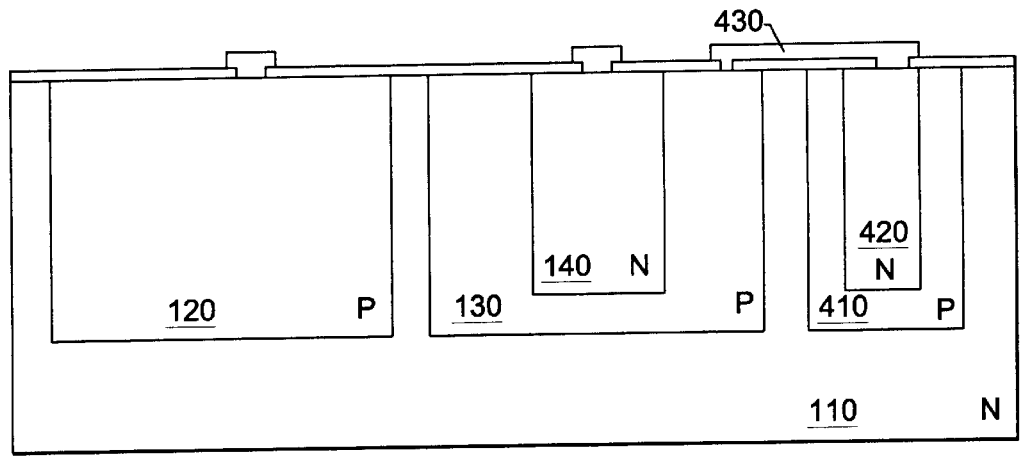
FIG. 4a shows schematically a known integrated structure for reducing the effects of a vertical parasitic transistor according to the prior art.
Figure 4B:
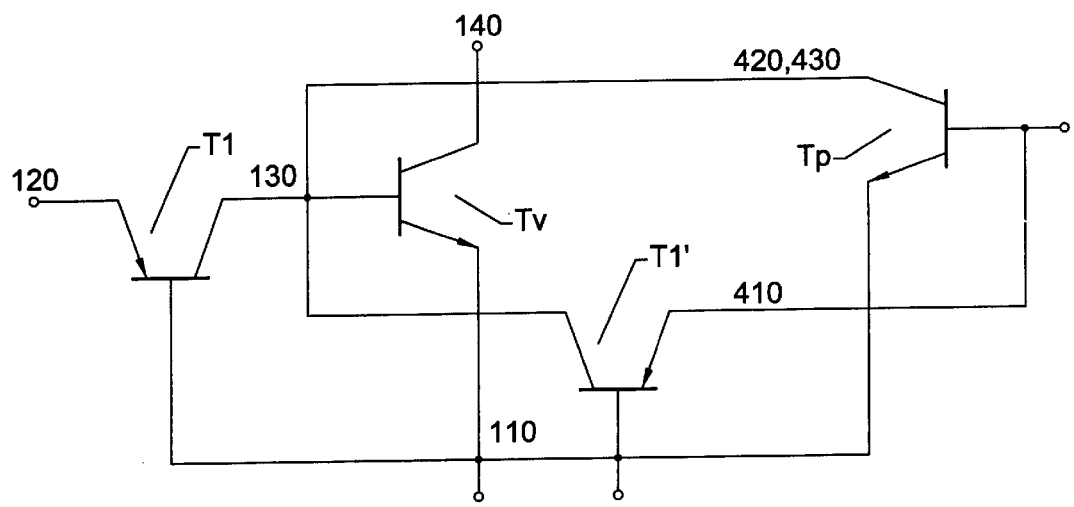
FIG. 4b shows the circuit equivalent to the structure of FIG. 4a according to the prior art.
Figure 5A:
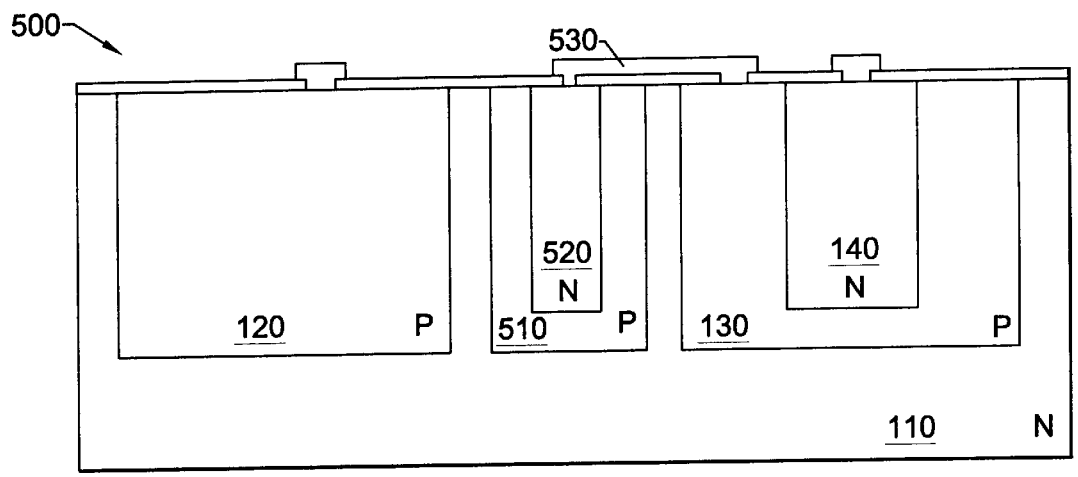
FIG. 5a shows a first embodiment of the integrated structure according to the present invention, in diagrammatic form.

With reference now to the drawings and with particular reference to FIG. 5a, (FIGS. 1a–4b have been described above) this shows, in diagrammatic form, a first embodiment of the integrated structure according to the present invention. The integrated structure 500 comprises, as described above, an N-type epitaxial layer 110 in which two P-type regions 120 and 130 are formed. In the region 130 there is a further N-type region 14.

In the portion of the epitaxial layer 110 disposed between the P-regions 120 and 130, that is, in the base region of the lateral parasitic transistor formed between the two P regions, a further P-type region 510 is formed, inside which an N-type region 520 is formed. The N-type region 520 is connected electrically to the region 130, for example, by means of a surface metal contact strip 530.

Figure 5B:
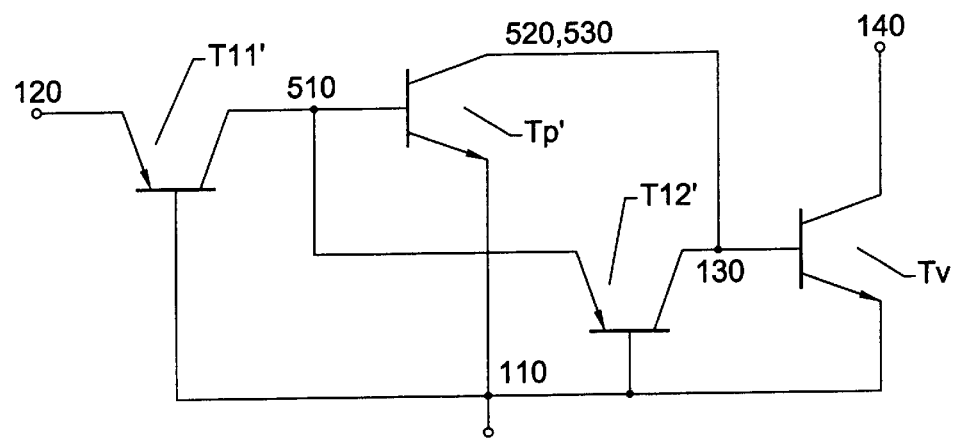
FIG. 5b shows the circuit equivalent to the structure of FIG. 5a, FIG. 6a shows a second embodiment of the integrated structure according to the present invention, in diagrammatic form.

The circuit equivalent to the structure described above is shown in FIG. 5b. The circuit shown in the drawing comprises a lateral parasitic PNP transistor Tl1' created by the P region 120 (emitter), by the N epitaxial layer 110 (base) and by the P-type region 510 (collector) and a lateral parasitic PNP transistor Tl2' created by the P-type region 510 (emitter), by the N epitaxial layer 110 (base) and by the region 130 (collector). As shown in the drawing, the two transistors Tl1' and Tl2' have a common base (the epitaxial layer 110).

The integrated structure according to the present invention comprises a vertical NPN transistor Tp' constituted by the N-type region 520 (collector), by the P-type region 510 (base) and by the N epitaxial layer 110 (emitter). As shown in the drawing, the base of the transistor Tp' is connected to the collector of the transistor Tl1' and to the emitter of the transistor Tl2' (common P-type region 510). The emitter of the transistor Tp' is connected to the bases of the transistors Tl1' and Tl2' (common epitaxial layer 110). Moreover, the collectors of the two transistors Tp' and Tl2' are connected to one another by means of the metal connection 530.

The integrated structure of the embodiment shown therefore comprises, as described above, the vertical parasitic NPN transistor Tv created by the N region 140 (collector), by the P region 130 (base and by the N epitaxial layer 110 (emitter). As shown in the drawing, the base of the transistor Tv is connected to the collector of the transistor Tl2' (common region 130) and to the collector of the transistor Tp', by means of the metal connection 530; the emitter of the transistor Tv is connected to the bases of the transistors Tl1' and Tl2' and to the emitter of the transistor Tp' (common epitaxial layer 110).

It can be noted from an observation of the circuit shown in the drawing that the current supplied by the transistor Tl1' is divided into a portion which is injected into the region 130 by means of the transistor Tl2' and a portion which serves to activate the transistor Tp'. The transistor Tp' enables all or some of the current injected by the transistor Tl2' into the region 130 to be extracted by means of its collector. The current thus extracted from the region 130 is sent to the epitaxial layer and hence to the substrate of the integrated structure by means of the emitter of the transistor Tp'.

In particular, the current injected from the region 120 into the region 130, which is equal to the base current Ibv of the transistor Tv is given by:

$$Ibv = Icl2' - Icp' = \frac{\beta l2'}{1+\beta l2'} Iel2' - \beta p' \cdot Ibp'$$

If k is the ratio between the base current Ibp' of the transistor Tp' and the emitter current Iel2' of the transistor Tl2' (k=Ibp'/Iel2'):

$$Ibp'=k \cdot Iel2'; \quad Icl1'-Iel2'=k \cdot Iel2'; \quad (1+k) \cdot Iel2'=Icl1'$$

from which the following is derived:

$$Iel2' = \frac{Icl1'}{1+k}$$

By substituting these equations in the formula which defines the base current Ibv of the transistor Tv:

$$Ibv = \frac{\beta l2'}{1+\beta l2'} \frac{Icl1'}{1+k} - \beta p' \frac{k \cdot Icl1'}{1+K} = \left( \frac{\beta l2'}{(1+\beta l2')(1+k)} - \frac{k \cdot \beta p'}{1+k} \right) Icl1'$$

$$Ibv = \left( \frac{\beta l2'}{(1+\beta l2')(1+k)} - \frac{k \cdot \beta p}{1+k} \right) \frac{\beta l1'}{1+\beta l1'} Iel1'$$

from which it can be found that the current injected from the region 120 into the region 130 is:

$$Ibv = \left( \frac{\beta l1' \cdot \beta l2'}{(1+\beta l1')(1+\beta l2')(1+K)} \frac{k \cdot \beta p'}{1+k} \frac{\beta l1'}{1+\beta l1'} \right) Iel1'$$

The advantage offered by the solution of the present invention, in terms of reduction of the current injected into the region 130, is clear from a comparison of the formula derived above with those given previously for the circuits of the prior art. It can be seen that the current injected into the region 130 in the structure according to the present invention is always less than that of the known circuits, in spite of the fact that the current gain βp' of the transistor Tp' is generally quite low (because of the low level of doping of the emitter region).

If the transistor Tp' succeeds in causing a current greater than that injected by the transistor Tl2' to circulate, as it becomes saturated, it connects the base and the emitter of the parasitic transistor Tv to the same potential preventing it from being switched on. The structure described above therefore also acts as a dynamic insulation circuit between the region 130 and the substrate of the integrated structure. The integrated structure according to the present invention therefore offers a solution which can reduce (or even nullify) the injection of current between two homologous regions, at the same time preventing any vertical parasitic transistors from being switched on.

It is important to point out that the integrated structure according to the present invention does not require a driver stage and, in particular, does not require a constant-current generator to supply the current to the base terminal of the transistor Tp'. In fact, for this purpose it uses the current which is injected from one P-type region to the other, thus reducing the power absorbed from the supply of the integrated structure. In any case, it is also possible to provide dedicated driving circuitry which anticipates the switching-on of the transistor Tp', fixing its switching threshold at a level below that achieved automatically by the circuit described above.

It will be noted that the current supplied to the base terminal of the transistor Tp' depends upon the size of the negative voltage difference between the substrate (and hence the epitaxial layer 110) and the P-type regions. Since the current which is injected by the region 120 into the region 130 and which the transistor Tp' has to extract also depends on the same voltage difference, the integrated structure according to the present invention clearly forms a system in which the base current of the transistor Tp' is auto-adaptive.

In many applications, the region 120 is connected to a reference terminal (earth or ground). A typical example is that of a mixed integrated circuit (signal and power) in which the region 120 is the anode of a recirculating diode associated with a power transistor. In this case, when the potential of the epitaxial layer 110 (that is, the cathode of the recirculating diode in the example given above) falls to a potential below that of the earth, that is, to the potential of the region 120, a current which comes from the same earth terminal through the lateral parasitic transistor Tl1' is supplied to the base terminal of the transistor Tp'.

It will be noted that, in the integrated structure according to the present invention, the channels formed between the P-type region 510 and the P-type regions 120 and 130 can retain limited dimensions so that, if the substrate (and hence the epitaxial layer 110) has to withstand high voltages (as in the mixed integrated circuit described above), the field lines generated by this voltage do not succeed in reaching the upper surface of the chip. The integrated structure according to the present invention does not therefore need termination devices with a consequent saving in chip area.

A further advantage of the structure according to the present invention is that the current is extracted from the region 130 close to the region into which it is injected from the region 120. The path of the current is thus reduced, preventing consequent voltage drops, particularly along the metal strip 530 which connects the region 130 to the vertical transistor Tp'. This advantage is particularly important in the case of a mixed integrated circuit in which the P-type region 130 is the region insulating a well in which the signal-processing components of the control circuitry are integrated. In fact, in this case, it would be necessary to have a fairly dense network of surface metal contact strips connecting a fairly extensive region in the narrow regions available between the various signal components.

Figure 6A:
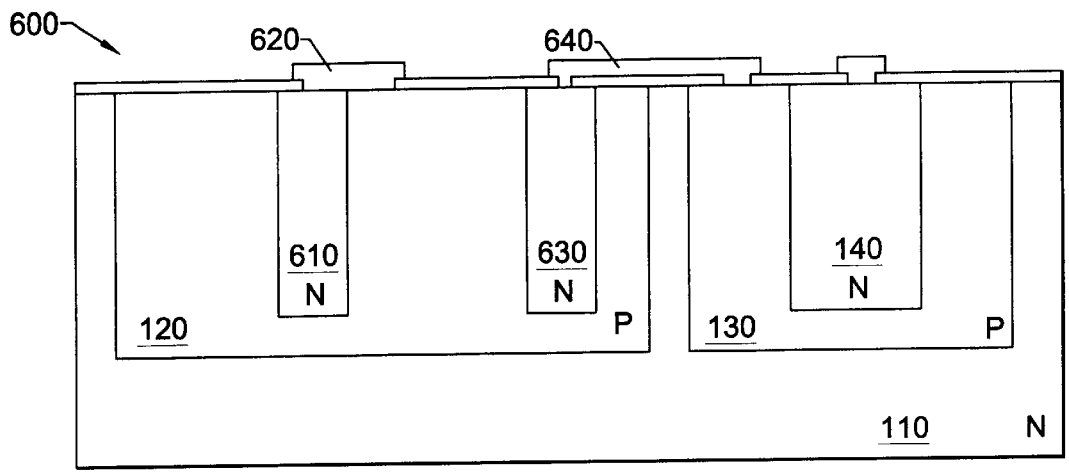

With reference now to FIG. 6a, this shows schematically a second embodiment of the integrated structure according to the present invention. The integrated structure 600 comprises, as described above, an N-type epitaxial layer 110, in which two P-type regions 120 and 130 are formed. A further N-type region 140 is present within the region 130.

The region 120 comprises an N-type region 610 electrically connected to the region 120 by means of a surface metal contact strip 620. In this embodiment of the present invention the P-type region which, in the embodiment of FIG. 5a, defines the base region of the transistor Tp' (the P region 510 in which the N region 520 is formed) is joined to the P region 120. In practice, a further N-type region 630 (corresponding to the N region 520 of FIG. 5a) is formed in the region 120 and is connected electrically to the region 130 by means of a further surface metal contact strip 640 (corresponding to the metal strip 530 of FIG. 5a).

Figure 6B:
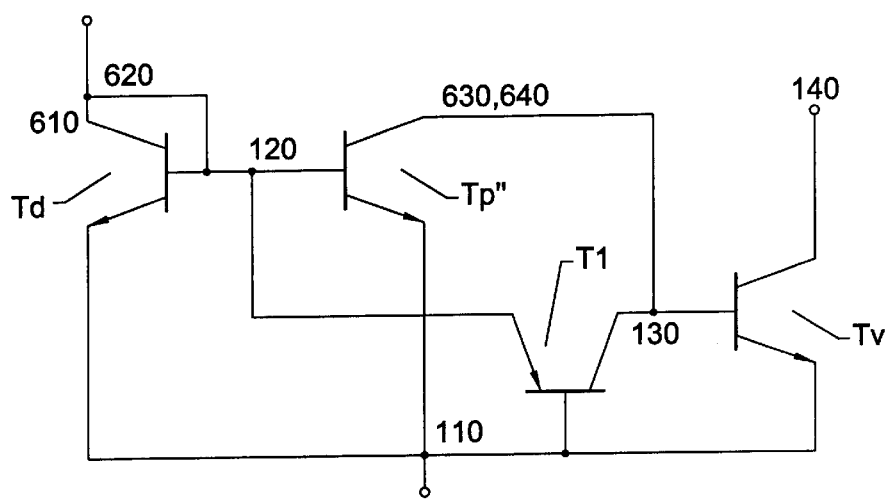

The circuit equivalent to the structure described above is shown in FIG. 6b. The circuit shown in the drawing comprises, as described above, the lateral parasitic PNP transistor Tl created by the P-type region 120 (emitter), by the N epitaxial layer 110 (base), and by the P-type region 130 (collector) and the vertical parasitic NPN transistor Tv created by the N region 140 (collector), by the P-type region 130 (base) and by the N epitaxial layer 110 (emitter). As shown in the drawing, the collector of the transistor Tl is connected to the base of the transistor Tv (common region 130) and the emitter of the transistor Tv is connected to the base of the transistor Tl (common epitaxial layer 110).

The integrated structure of FIG. 6a comprises a vertical NPN transistor Td constituted by the N-type region 610 (collector), by the P-type region 120 (base), and by the N epitaxial layer 110 (emitter). The emitter of the transistor Td is connected to the base of the transistor Tl and to the emitter of the transistor Tv (common epitaxial layer 110). The base of the transistor Td is also short-circuited to its own collector by means of the metal strip 620. The transistor Td therefore forms a diode of which the anode is constituted by the base terminal and the cathode by the emitter terminal. This structure is typically used in a mixed integrated circuit (signal and power) in which the base-emitter diode constituted by the transistor Td has its anode connected to the earth terminal and constitutes a recirculating diode for a power transistor.

The integrated structure of the present embodiment of the invention comprises a vertical NPN transistor Tp" constituted by the N-type region 630 (collector), by the P-type region 120 (base) and by the N epitaxial layer 110 (emitter). This solution therefore provides for the transistor Tp" which has the same function as the transistor Tp' of the structure of FIG. 5a, to be integrated within the same region 120. As shown in the drawing, the base of the transistor Tp" is connected to the base of the transistor Td and to the emitter of the transistor Tl (common region 120) and the emitter of the transistor Tp" is connected to the base of the transistor Tl and to the emitters of the transistors Td and Tv (common epitaxial layer 110). Moreover, the collectors of the two transistors Tp" and Tl are connected to one another by the metal connection 640.

From an observation of the circuit shown in the drawing it can be noted that the two transistors Td and Tp" define a current mirror so that the collector current of the transistor Tp" is proportional to the current entering through the metal strip 620 of the transistor Td (less the portion injected into the region 130 by the lateral parasitic transistor Tl). This current mirror thus provides the necessary current to the base terminal of the transistor Tp" making use of the current circulating in the diode constituted by the transistor Td.

As well as taking up a smaller area than that of the structure of FIG. 5a, the integrated structure described offers all of the advantages of the structure described previously. In particular, the current which is injected from the region 120 into the region 130 and which the transistor Tp" has to extract depends upon the size of the negative voltage difference between the substrate (and hence the epitaxial layer 110) and the region 120. The same dependency applies to the current circulating in the diode constituted by the transistor Td and, with reference to the foregoing, also in the transistor Tp".

We claim:

1. A structure integrated in a chip of semiconductor material of first conductivity type and comprising:

first and second regions of second conductivity type extending into the chip of semiconductor material from a surface thereof and forming first and second junctions; and means for reducing an injection of current from the first region to the second region when the first junction is polarized for transmission, said means for reducing an injection current comprising a third region of second conductivity type extending from the surface into a portion of the chip of semiconductor material disposed between the first region and the second region, and electrical connection means extending between the first region and third region, a fourth region of first conductivity type extending from the surface into the third region, electrical connection means between the fourth region and the second region; and a power transistor for controlling an inductive load and having its collector region as the chip of semiconductor material, and wherein the first junction defines a recirculating diode associated with the power transistor.

2. An integrated structure according to claim 1, wherein said electrical connection means comprises a metal conductor in surface ohmic contact with the fourth region and the second region.

3. An integrated structure according to claim 1, further comprising a fifth region of first conductivity type extending from the surface into the second region.

4. An integrated structure according to claim 3, and further comprising a sixth region of first conductivity type extending from the surface into the first region, and surface electrical connection means between the sixth region and the first region.

5. An integrated structure according to claim 1, wherein the first conductivity type is N type, and the second conductivity type is the P type.

6. A structure integrated in a chip of semiconductor material of first conductivity type and comprising:

a power transistor for controlling an inductive load and having its collector region as the chip of semiconductor material;

first and second regions of second conductivity type extending into the chip of semiconductor material from a surface thereof and forming first and second junctions, the first junction defining a recirculating diode associated with the power transistor; and means for reducing an injection of current from the first region to the second region when the first junction is polarized for transmission, said means for reducing an injection current comprising a third region of second conductivity type extending from the surface into a portion of the chip of semiconductor material disposed between the first region and the second region, and electrical connection means extending between the first region and third region, a fourth region of first conductivity type extending from the surface into the third region, and a metal conductor in surface ohmic contact with the fourth region and the second region.

7. An integrated structure according to claim 6, further comprising a fifth region of first conductivity type extending from the surface into the second region.

8. An integrated structure according to claim 7, and further comprising a sixth region of first conductivity type extending from the surface into the first region, and surface electrical connection means between the sixth region and the first region.

9. An integrated structure according to claim 7, wherein the first conductivity type is N type, and the second conductivity type is the P type.

* * * * *